United States Patent [19]

Darms et al.

[11] Patent Number: 4,496,794

[45] Date of Patent: Jan. 29, 1985

[54] FLEXIBLE BASE MATERIALS, THEIR PREPARATION AND THEIR USE FOR PRINTED CIRCUITS

[75] Inventors: Roland Darms, Therwil; Harry Beyeler, Basel; Theobald Haug, Frenkendorf, all of Switzerland

[73] Assignee: Ciba Geigy Corporation, Ardsley, N.Y.

[21] Appl. No.: 617,821

[22] Filed: Jun. 4, 1984

Related U.S. Application Data

[63] Substitute for Ser. No. 531,590, Sep. 13, 1983, abandoned, which is a continuation of Ser. No. 422,423, Sep. 23, 1982, abandoned, which is a continuation of Ser. No. 298,964, Sep. 3, 1981, abandoned.

[30] Foreign Application Priority Data

Sep. 15, 1980 [CH] Switzerland ................... 6903/80

[51] Int. Cl.³ .............................................. H05K 1/00
[52] U.S. Cl. ................................. 174/68.5; 428/458; 428/473.5; 428/474.4; 427/96; 528/125
[58] Field of Search ............ 174/68.5; 428/458, 473.5, 428/474.4; 528/125; 427/96

[56] References Cited

U.S. PATENT DOCUMENTS 3,682,960 8/1972 Haller .
3,809,591 5/1974 Vogelfanger et al. .
4,148,969 4/1979 Henderson .
4,196,144 4/1980 Darms .
4,239,880 12/1980 Darms .

FOREIGN PATENT DOCUMENTS 2726541 1/1978 Fed. Rep. of Germany .
69103134 1/1977 Japan .
1366490 9/1974 United Kingdom .

Primary Examiner—George F. Lesmes
Assistant Examiner—E. Rollins Buffalow
Attorney, Agent, or Firm—Luther A. R. Hall

[57] ABSTRACT

Flexible base materials consisting of a metal foil and a film of a polyamide, polyamide-imide and/or polyimide, firmly adhering thereto without an intermediate layer, the film being obtained by heating a polyamide, polyamide-amidoacid and/or polyamide-acid containing the structural units of the formulae I and II.

The individual symbols are as defined in claim 1.

The base materials according to the invention are useful for the production of flexible printed circuits.

7 Claims, No Drawings

FLEXIBLE BASE MATERIALS, THEIR PREPARATION AND THEIR USE FOR PRINTED CIRCUITS

This is a divisional of application Ser. No. 531,590, filed Sept. 13, 1983, which in turn is a continuation of application Ser. No. 422,423, filed Sept. 23, 1982, now abandoned, which in turn is a continuation of application Ser. No. 298,964, filed Sept. 3, 1981, now abandoned.

The present invention relates to flexible base materials consisting of a metal foil coated with a polyamide, polyimide or polyamide-imide to processes for their preparation and to their use for the production of flexible printed circuits.

It is known that flexible printed circuits offer numerous technical advantages over rigid printed circuits. They are easier to handle, since they can be inserted in virtually any shape as an electronic component into the system concerned accordingly occupy less space in the electrical equipment, and are also less sensitive to vibrations.

However, the flexible base material, namely the insulant-coated metal foil, which is used to produce printed circuits, has to conform to high standards. The coating must exhibit very good adhesion to the metal foil and must withstand, without damage, the operations involved in the production of printed circuits, i.e. the coating must have good resistance to a soldering bath and good resistance to the solvents employed in printed circuit technology. Furthermore, it must be possible to bend, roll, twist and fold the flexible base material without cracking or flaking-off of the coating.

It is known to coat metal foils with polyimide films by laminating the polyimide film onto a copper foil provided with a binder. Laminates prepared in this manner and containing a binder layer do not conform to the required standards in all respects; in particular, the electrical properties leave someting to be desired.

Further, it is known from U.S. Pat. No. 3,682,960 to coat metals with a mixture of a polyamide-acid and an amide-modified polyamide-acid. The coatings of polyimides and polyamide-imides obtained on the metals after heating however suffer from the disadvantage that they are insufficiently flexible and easily flake off the metal foil.

To circumvent these disadvantages, U.S. Pat. No. 4,148,969 consequently proposes to use laminates of metal foils coated with polyparabanic acids, the polyparabanic acid used being prepared by hydrolysis of the reaction product of diphenylmethane diisocyanate with hydrogen cyanide. Apart from the fact that the preparation of the polyparabanic acid used is complicated, hydrogen cyanide has to be employed in the preliminary stage, for which additional precautionary measures must be taken.

It has now been found that flexible base materials consisting of polymer films which adhere firmly, without an intermediate layer, to metal foils are obtained in a simpler manner if the metal foil is coated with a powder, a film or an organic solution of a polyamide, polyamide-acid or polyamide-amidoacid and the coated metal foil is heated to an elevated temperature, with melting of the powder or evaporation of the organic solvent.

Accordingly, the present invention relates to flexible base materials which are used for the production of flexible printed circuits and consist of a metal foil coated with a polymer without an intermediate layer, wherein the polymer coating consists of a polyamide, polyamide-imide and/or polyimide and is obtained by heating a polyamide, polyamide-amidoacid and/or polyamide-acid which consists of 1 to 100 mol % of structural units of the formula I

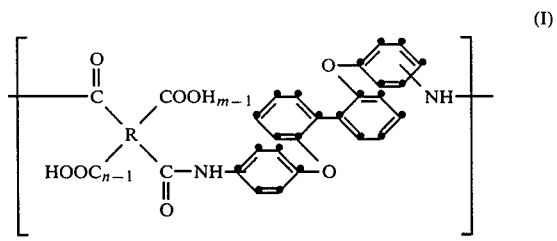

and of 0 to 99 mol % of structural units of the formula II

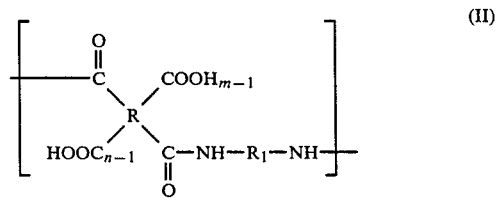

in which the NH groups in formula I are, independently of one another, bonded to the o-, m- or p-position of the benzene nucleus and the individual symbols or radicals m, n, R and $R_1$, independently of one another, are defined as follows: m and n are each 1 or 2, R is a carbocyclic-aromatic or heterocyclic-aromatic radical, in which the carboxamide groups and carboxyl group are bonded to different carbon atoms and the carboxyl groups, if R is a cyclic radical and at least one of m and n is 2, are each in the ortho-position to a carboxamide group, and $R_1$ is a carbocyclic-aromatic or heterocyclic-aromatic radical, and the derivatives which may have been obtained by cyclising to the corresponding imide, at temperatures of between 50° and 350° C.

Preferably, the base material according to the invention contains a copper foil as the metal foil.

The coating which adheres firmly to the metal foil preferably consists of a polyamide, polyamide-imide and/or polyimide, which is obtained from a polyamide, a polyamide-amidoacid or polyamide-acid containing the structural units of the formulae I and II, in which, in formula I, the two NH groups are bonded to the p-position of the benzene nucleus, R and $R_1$ are aromatic radicals and m and n are as defined for formulae I and II.

In particular, the coatings consist of a polyamide, polyamide-imide and/or polyimide, which is obtained from a polyamide, a polyamide-amidoacid or polyamide-acid containing the structural units of the formulae I and II, wherein R, if m and n=2, is a benzene ring or the benzophenone ring system, and if m and n=1, is a benzene ring, and $R_1$ is a 1,3- or 1,4-phenylene group, or a 4,4'-diphenyl-ether, 4,4'-diphenylmethane or 4,4'-diphenylsulfone radical, or from the derivatives obtained by cyclising to the corresponding imides.

In a preferred embodiment, the base material carries a coating of a polyamide containing 100 mol % of the structural units of the formula I, in which m and n=1 and R is 1,3- and/or 1,4-phenylene.

In a particularly preferred embodiment, the base material carries a coating of a polyamide which consists of 1 to 40 mol % of structural units of the formula I and of 60 to 99 mol % of structural units of the formula II, wherein m and n=1, R is a benzene ring and $R_1$ is a 1,3- or 1,4-phenylene group.

In a further particular embodiment, the base material carries a coating of a polyimide which is obtained by heating a polyamide-acid, which consists of 1 to 20 mol % of structural units of the formula I and of 80 to 99 mol % of structural units of the formula II, wherein m and n=2, R is a benzene ring or the benzophenone ring system and $R_1$ is a 4,4'-diphenyl-ether, 4,4'-diphenylmethane or 4,4'-diphenyl-sulfone radical, or by heating a derivative obtained by cyclising to the corresponding imide.

The flexible base materials according to the invention are obtained by coating a metal foil, preferably a Cu foil, with a powder, a film or an organic solution of a polyamide, a polyamide-amidoacid and/or a polyamide-acid containing the structural units of the formula I or II or of the derivatives which may have been obtained by cyclising to the corresponding imides, and heating the coated metal foil at temperatures of between 50° and 350° C.

The polyamides, polyamide-amidoacids and polyamide-acids used to coat the metal foils, and the corresponding derivatives which have been obtained by cyclising to the imide, are known from German Offenlegungsschrift No. 2,726,541 and can be prepared by condensing 1–100 mol % of a diamine of the formula III

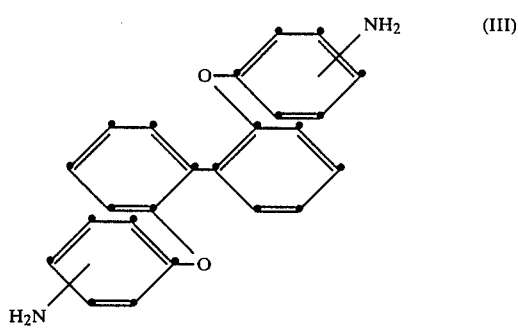

in which the $NH_2$ groups, independently of one another, are in the o-, m- or p-position of the benzene nucleus, and 0–99 mol % of a diamine of the formula IV $$H_2N-R_1-NH_2 \qquad (IV)$$

with a substantially stoichiometric amount of a compound of the formula V

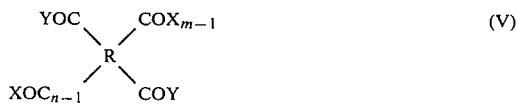

in which m, n, R and $R_1$ are as defined for formulae I and II and X, if m and/or n=2, conjointly with Y forms the group —O—, and Y is a chlorine atom, a hydroxyl group, an unsubstituted or substituted phenoxy group or an alkoxy group having 1–18, especially 1–12, carbon atoms, or Y, if m and/or n=2, together with X forms the group —O—, the groups —COY and —COX being bonded to different carbon atoms and the —COY— group or groups being in the ortho-position to a —COX group if R is a cyclic radical and m and/or n=2, and, if desired, subsequently cyclising the resulting polymers, in which m and/or n=2, to the imide.

The polyamides, polyamide-amidoacids and polyamide-acids used according to the invention in general have an intrinsic viscosity in N,N-dimethylacetamide (DMA), at 25° C., of about 0.4 to 4.0 dl/g, especially of 0.7 to 2.5 dl/g. The intrinsic viscosity of the cyclised derivatives, i.e. of the polyamide-imides and polyimides, in concentrated $H_2SO_4$ or DMA, at 25° C., is of the same order of magnitude.

The intrinsic viscosity $\eta_{int.}$, which is a measure of the molecular weight of a polymer, is calculated from the following equation:

$$\eta_{int.} = \frac{\ln \frac{\eta}{\eta_o}}{c}$$

wherein ln=natural logarithm, $\eta$=viscosity of the solution (0.5% by weight of polymer in a suitable solvent, for example N,N-dimethylacetamide, N,N-dimethylformamide or N-methylpyrrolidone), $\eta_o$=viscosity of the solvent and c=concentration of the polymer solution in g of polymer/100 ml of solvent.

The viscosity measurements are carried out at 25° C. As is generally known, the intrinsic viscosity is a measure of the molecular weight of a polymer. The quoted values of $\eta_{int.}$=0.4 to 4.0 correspond to mean molecular weights of about 5,000 to 50,000. The mean molecular weight can be determined by methods known per se, for example by means of light scattering.

The polymers used according to the invention can be homopolymers or copolymers with a random distribution of the individual structural units of the formulae I and II. In the individual structural units, the symbols or radicals m, n, R and $R_1$ can furthermore have different meanings. However, the polymer can also be copolymers with any desired, at least partially block-like, arrangements of polyamide, polyamid-amidoacid or polyamid-acid structural units of the formulae I and II, as defined. Such copolymers can be obtained, for example, by first reacting a diamine of the formula III with a slight excess of a particular dicarboxylic, tricarboxylic or tetracarboxylic acid derivative of the formula V, for example a dicarboxylic acid derivative, and then adding, to the reaction mixture, a different dicarboxylic, tricarboxylic or tetracarboxylic acid derivative of the formula V, a diamine of the formula IV and/or a further diamine of the formula III.

The optional cyclisation of the polyamide-acids or polyamide-amidoacids (having structural units of the formula I and II, wherein m and/or n=2), obtained after condensation, is carried out chemically or thermally, in a manner known per se.

The chemical cyclisation is advantageously effected by treatment with a dehydrating agent, used alone or as a mixture with a tertiary amine. Examples of suitable dehydrating agents are acetic anhydride, propionic anhydride and dicyclohexylcarbodiimide, and mixtures of acetic anhydride and triethylamine.

Thermal cyclisation is effected by heating at temperatures of about 50° to 300° C., preferably about 150° to 250° C., with or without addition of an inert organic solvent.

The cited German Offenlegungsschrift No. 2,726,541 furthermore discloses that the polyamides, polyamide-acids the polyamide-amidoacids can be used for the preparation of films, coating compositions and laminates, and also as laminating resins, but contains no indication that the metal foils coated with the polymers are extremely flexible, i.e. withstand repeated bending and folding without cracking of the polymer film, and furthermore have good resistance to a soldering bath and good resistance to the solvents employed in printed circuit technology.

The polyamides, polyamide-amidoacids and polyamide-acids used according to the invention, which are preferably prepared in an anhydrous organic solvent and with exclusion of moisture, are advantageously used in the form of these organic solutions. Suitable organic solvents are N,N-dimethylacetamide, N,N-diethylacetamide, N,N-dimethylformamide, N,N-dimethylmethoxyacetamide, N-methyl-2-pyrrolidone, N-acetyl-2-pyrrolidone, N-methyl-ε-caprolactam, hexamethylphosphorotriamide (hexametapol), N,N,N',N'-tetramethylurea, tetrahydrothiophene dioxide (sulfolan) and dimethylsulfoxide. Mixtures of such solvents can also be used. On the other hand, it is also possible to dilute these preferred solvent systems with other organic aprotic solvents, such as aromatic, cycloaliphatic or aliphatic hydrocarbons, which can be chlorinated, for example benzene, toluene, xylenes, cyclohexane, pentane, hexane, petroleum ether, methylene chloride, tetrahydrofuran, cyclohexanone and dioxane.

In order to increase the shelf life of the organic solution of the polymers employed, it is advantageous to add a water-absorbing substance, for example a molecular sieve, to the solution. Molecular sieves are advantageously introduced in amounts of about 10 percent by weight, based on the amount of the organic solution. The molecular sieves are commercially available products, for example from Merck.

Surprisingly, it has also been found that it is advantageous to add a flow control agent, for example "Modaflow" (a commercial product from Monsanto) to the organic coating solutions which are processed at an elevated temperature or by machine, prior to processing.

The coating of the metal foils with the organic polymer solutions can be carried out manually or with coating machines, including vertical coating machines. However, in the case of machine coating it is important that a non-tacky coating be obtained on the metal foil, so that the laminate can, if desired, be rolled up. To achieve optimum properties, the laminate can subsequently be heated at higher temperatures, for example 4 hours at 180° C. and 2 hours at 250° C., which results in virtually complete cyclisation of the amidoacid groups to the imide groups.

To coat the metal foils, it is also possible to employ the polyamides, polyamide-amidoacids and polyamide-acids used according to the invention, as well as the derivatives which may have been obtained by cyclising to the imide, in the form of powders or films which are then fused onto the metal foils.

The metal foils coated in this way can be used direct for the production of printed circuits, by exposing the foil, provided with a photo-resist lacquer on the metal face, through a photographic mask and developing the exposed metal foil in a known manner. This results in flexible printed circuits of great mechanical strength.

EXAMPLE 1

(A) Preparation of a polyamide

A clear solution of 22.80 g (0.062 mol) of 2,2'-di(p-aminophenoxy)-diphenyl in 100 g of anhydrous N,N-dimethylacetamide is prepared by stirring under nitrogen at 40°–50° C. in a sulfonation flask, equipped with a stirrer, internal thermometer, dropping funnel, gas inlet tube and pressure-compensating vessel. The solution is cooled to $-5°$ C. and 12.58 g (0.062 mol) of isophthalic acid dichloride are introduced in the course of 30 minutes at $-5°$ C. to 0° C., with vigorous stirring; during this addition, the reaction mixture becomes noticeably viscous and pale beige. The reaction is then completed by allowing a further 30 minutes. Thereafter, 12.55 g (0.124 mol) of triethylamine are added dropwise in the course of 30 minutes at 0° to 5° C., and the reaction is completed by allowing a further hour at the same temperature. The reaction mixture is then diluted with 22 g of anhydrous N,N-dimethylacetamide and mixed until homogeneous. The triethylamine hydrochloride which precipitates is filtered off on a glass frit and the filter cake is rinsed with 20 g of anhydrous N,N-dimethylacetamide. A clear, viscous solution is obtained; the polymer therein has an inherent viscosity of 0.98 dl/g at 25° C. (c=0.5% in N,N-dimethylacetamide). The solution can be used direct for coating Cu foils.

(B) Coating of Cu foils and production of a printed circuit

The polyamide solution obtained above is spread uniformly, by means of a doctor, on Cu foils, and the coatings are predried for 7 hours at 70°–150° C./20 mbar and are thereby freed from solvent. The laminates are then heat-treated for 10 hours at 200° C./0.10 mbar. Firmly adhering, transparent, flexible coatings are obtained on the Cu foils.

To produce a printed circuit, the laminate was coated on the Cu face with a photoresist lacquer, exposed through a photographic mask, developed in a chlorinated solvent and etched in $FeCl_3$. A flexible printed circuit, with excellent adhesion of the conductor tracks, was obtained.

What is claimed is:

1. A flexible, printed circuit with excellent adhesion of the printed circuit tracks, which is obtained by
coating one side of a metal foil without any interlayer with a polymer consisting of a polyamide, polyamide-imide or polyimide, obtained by heating a polyamide, polyamide-amidoacid or polyimide-acid having 1 to 100 mol % of structural units of the formula I

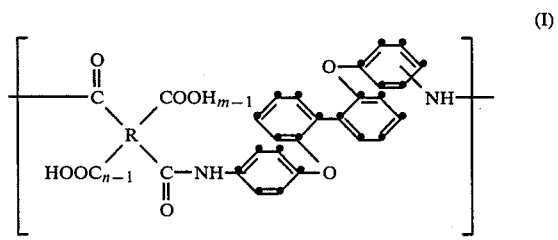

and of 0 to 99 mol % of structural units of the formula II

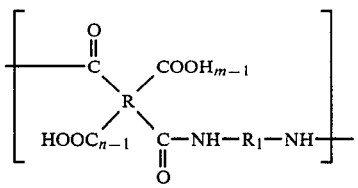
(II)

in which the NH groups in formula I are, independently of one another, bonded to the o-, m- or p-position of the benzene nucleus and the individual symbols or radicals m, n, R and $R_1$, independently of one another, are defined as follows: m and n are each 1 or 2, R is a carbocyclic-aromatic or heterocyclic-aromatic radical, in which the carboxamide groups and carboxyl groups are bonded to different carbon atoms and the carboxyl groups, if R is a cyclic radical and at least one of m and n is 2, are each in the ortho-position to a carboxamide group, and $R_1$ is a carbocyclic-aromatic or heterocyclic-aromatic radical, heating the coated metal foil in the temperature range from 50° to 350° C. till a track-free coating is obtained, exposing the opposite side of the coated metal foil, which side is provided with a photolacquer, through a photo mask, and developing the exposed metal foil.

2. A circuit according to claim 1, wherein the coated metal foil is a copper foil.

3. A circuit according to claim 1, wherein the polymer is obtained from a polyamide, a polyamide-amidoacid on a polyamide-acid containing the structural units of the formulae I and II, in which, in formula I, the two NH groups are bonded to the benzene nucleus in the p-position, R and $R_1$ are aromatic radicals and m and n are as defined in claim 1.

4. A circuit, according to either of claims 1, wherein the polymer is obtained from a polyamide, a polyamide-amidoacid or polyamide-acid containing structural units of the formulae I and II, in which R, if m and n=2, is a benzene ring or the benzophenone ring system and, if m and n=1, is a benzene ring, and $R_1$ is a 1,3- or 1,4-phenylene group, or a 4,4'-diphenyl-ether, 4,4'-diphenylmethane or 4,4'-diphenyl-sulfone radical, or from a derivative which has been obtained by cyclising to the corresponding imide.

5. A circuit, according to either of claim 1, wherein the polymer consists of a polyamide containing 100 mol % of the structural units of the formula I, in which m and n=1 and R is 1,3- and/or 1,4-phenylene.

6. A circuit, according to either of claims 1, wherein the polymer consists of a polyamide which contains 1 to 40 mol % of structural units of the formula I and 60 to 99 mol % of structural units of the formula II, in which m and n=1, R is a benzene ring and $R_1$ is a 1,3- or 1,4-phenylene group.

7. A circuit, according to either of claims 1, wherein the polymer is obtained from a polyamide-acid which consists of 1 to 20 mol % of structural units of the formula I and of 80 to 99 mol % of structural units of the formula II, in which m and n=2, R is a benzene ring or the benzophenone ring system and $R_1$ is a 4,4'-diphenylether, 4,4'-diphenylmethane or 4,4'-diphenyl-sulfone radical or from the derivative which has been obtained by cyclising to the corresponding imide.

* * * * *